(12) United States Patent
Tiwari

(10) Patent No.: US 11,444,093 B2
(45) Date of Patent: Sep. 13, 2022

(54) MEMORY ARRAYS AND METHODS OF FORMING MEMORY ARRAYS

(71) Applicant: Micron Technology, Inc., Boise, ID (US)

(72) Inventor: Chandra Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 329 days.

(21) Appl. No.: 16/739,581

(22) Filed: Jan. 10, 2020

(65) Prior Publication Data

US 2021/0217761 A1    Jul. 15, 2021

(51) Int. Cl.
| | |
|---|---|
| *H01L 27/11556* | (2017.01) |
| *H01L 27/11582* | (2017.01) |
| *G11C 5/02* | (2006.01) |
| *G11C 5/06* | (2006.01) |
| *G11C 16/04* | (2006.01) |

(52) U.S. Cl.
CPC ........ *H01L 27/11556* (2013.01); *G11C 5/025* (2013.01); *G11C 5/06* (2013.01); *G11C 16/04* (2013.01); *H01L 27/11582* (2013.01)

(58) Field of Classification Search
CPC ......... H01L 27/11556; H01L 27/11582; H01L 27/11565; H01L 27/11521; H01L 27/11568; G11C 5/025; G11C 5/06; G11C 16/04; G11C 16/02; G11C 16/0483
See application file for complete search history.

(56) References Cited

U.S. PATENT DOCUMENTS

| | | | |
|---|---|---|---|
| 6,066,869 A | 5/2000 | Noble et al. | |
| 8,492,278 B2 | 7/2013 | Good et al. | |
| 8,735,216 B2 | 3/2014 | Liu et al. | |
| 8,980,752 B2 | 3/2015 | Good et al. | |
| 9,786,673 B1 | 10/2017 | Cho et al. | |
| 9,893,083 B1 | 2/2018 | Wang et al. | |
| 9,997,353 B1 * | 6/2018 | Kumar | H01L 21/02422 |
| 10,014,309 B2 | 7/2018 | Dorhout et al. | |
| 10,381,377 B2 | 8/2019 | Wang et al. | |

(Continued)

OTHER PUBLICATIONS

U.S. Appl. No. 17/231,895, filed Apr. 15, 2021, by Chandolu et al.

(Continued)

*Primary Examiner* — Sitaramarao S Yechuri
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. A horizontal pattern of operative memory-cell pillars extends through the insulative tiers and the conductive tiers in individual of the memory blocks. The operative memory-cell pillars have intrinsic compressive mechanical stress. At least one dummy structure in the individual memory blocks extends through at least upper of the insulative tiers and the conductive tiers. The at least one dummy structure is at least one of (a) and (b), where (a): at a lateral edge of the horizontal pattern, and (b): at a longitudinal end of the horizontal pattern. The at least one dummy structure has intrinsic tensile mechanical stress. Other embodiments, including methods, are disclosed.

28 Claims, 10 Drawing Sheets

(56) References Cited

U.S. PATENT DOCUMENTS

| | | | |
|---|---|---|---|
| 10,388,665 B1 | 8/2019 | Xie et al. | |
| 10,553,607 B1 | 2/2020 | Howder et al. | |
| 2008/0014761 A1 | 1/2008 | Bhatia et al. | |
| 2011/0298013 A1 | 12/2011 | Hwang et al. | |
| 2012/0052672 A1 | 3/2012 | Nakanishi et al. | |
| 2012/0098050 A1 | 4/2012 | Shim et al. | |
| 2012/0119287 A1 | 5/2012 | Park et al. | |
| 2012/0168829 A1* | 7/2012 | Zhong | H01L 29/4983 257/E21.409 |
| 2013/0009236 A1 | 1/2013 | Lee et al. | |
| 2013/0140623 A1 | 6/2013 | Lee et al. | |
| 2015/0206900 A1 | 7/2015 | Nam et al. | |
| 2015/0214241 A1 | 7/2015 | Lee | |
| 2015/0303214 A1* | 10/2015 | Kim | H01L 27/11582 257/329 |
| 2015/0318301 A1 | 11/2015 | Lee et al. | |
| 2015/0340377 A1 | 11/2015 | Lee | |
| 2016/0049421 A1* | 2/2016 | Zhang | H01L 29/7845 257/314 |
| 2016/0204117 A1 | 7/2016 | Liu et al. | |
| 2016/0268302 A1 | 9/2016 | Lee et al. | |
| 2016/0343726 A1* | 11/2016 | Yune | G06F 3/0656 |
| 2017/0062470 A1 | 3/2017 | Han et al. | |
| 2017/0148805 A1 | 5/2017 | Nishikawa et al. | |
| 2017/0256645 A1 | 9/2017 | Chung et al. | |
| 2017/0278859 A1 | 9/2017 | Sharangpani et al. | |
| 2018/0047739 A1 | 2/2018 | Dorhout et al. | |
| 2018/0130814 A1 | 5/2018 | Lee | |
| 2018/0261615 A1 | 9/2018 | Minemura | |
| 2018/0261616 A1* | 9/2018 | Cho | H01L 27/11519 |
| 2018/0294273 A1 | 10/2018 | Liao et al. | |
| 2018/0342528 A1 | 11/2018 | Lee | |
| 2019/0019724 A1 | 1/2019 | Cheng et al. | |
| 2019/0067182 A1 | 2/2019 | Lee | |
| 2019/0088671 A1 | 3/2019 | Greenlee et al. | |
| 2019/0237476 A1 | 8/2019 | Lee et al. | |
| 2019/0312054 A1 | 10/2019 | Yun et al. | |
| 2019/0363100 A1 | 11/2019 | Lee et al. | |
| 2020/0098781 A1 | 3/2020 | Xiao | |
| 2020/0127005 A1 | 4/2020 | Otsu et al. | |
| 2020/0194373 A1 | 6/2020 | Baek et al. | |
| 2020/0295031 A1 | 9/2020 | Lue | |
| 2020/0312863 A1 | 10/2020 | Iwai et al. | |
| 2020/0388629 A1 | 12/2020 | Lee et al. | |
| 2020/0402890 A1 | 12/2020 | Chary et al. | |
| 2021/0043640 A1 | 2/2021 | Kawaguchi et al. | |
| 2021/0043647 A1 | 2/2021 | Kim et al. | |
| 2021/0050364 A1 | 2/2021 | Tapias et al. | |

OTHER PUBLICATIONS

Jang et al., "Vertical Cell Array using TCAT (Terabit Cell Array Transistor) Technology for Ultra High Density NAND Flash Memory", IEEE, Symposium on VLSI Technology Digest of Technical Papers, United States, 2009, pp. 192-193.
U.S. Appl. No. 16/545,375, filed Aug. 20, 2019, by Zhang et al.
U.S. Appl. No. 16/550,238, filed Aug. 25, 2019, by Hu et al.
U.S. Appl. No. 16/550,244, filed Aug. 25, 2019, by Tessariol et al.
U.S. Appl. No. 16/550,250, filed Aug. 25, 2019, by Greenlee et al.
U.S. Appl. No. 16/550,252, filed Aug. 25, 2019, by Xu et al.
U.S. Appl. No. 16/599,856, filed Oct. 11, 2019, by Billingsley et al.
U.S. Appl. No. 16/657,498, filed Oct. 18, 2019, by King et al.
U.S. Appl. No. 16/663,683, filed Oct. 25, 2019, by Machkaoutsan et al.
U.S. Appl. No. 16/664,618, filed Oct. 25, 2019, by Hu et al.
U.S. Appl. No. 16/728,962, filed Dec. 27, 2019, by Scarbrough et al.

* cited by examiner

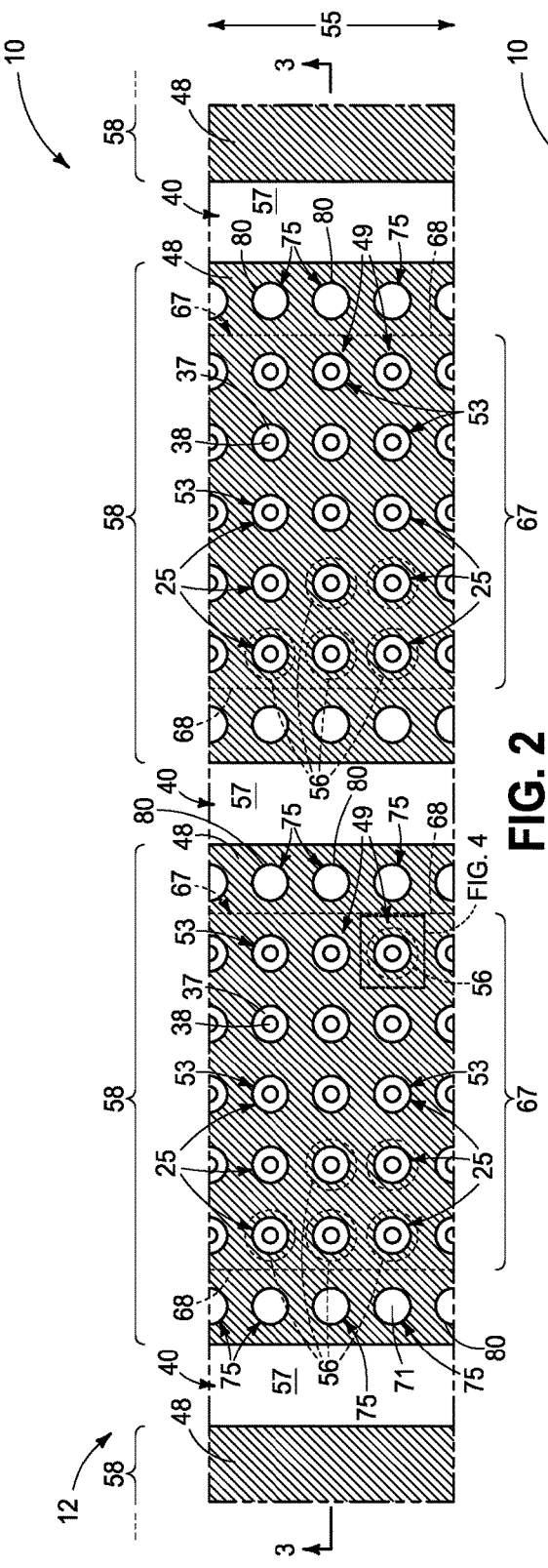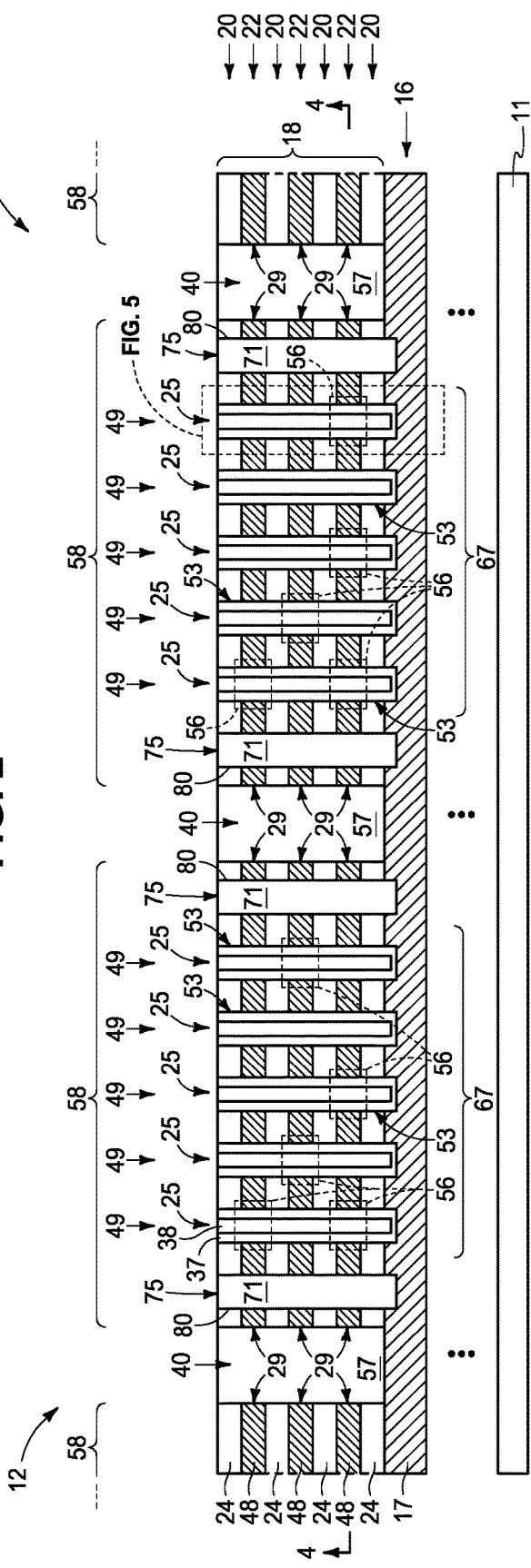

MEMORY ARRAYS AND METHODS OF FORMING MEMORY ARRAYS

TECHNICAL FIELD

Embodiments disclosed herein pertain to memory arrays and to methods of forming memory arrays.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 1-9 are views of a memory array comprising strings of memory cells in accordance with an embodiment of the invention.

DETAILED DESCRIPTION OF EXAMPLE EMBODIMENTS

Embodiments of the invention encompass a memory array, for example an array of NAND or other memory cells having peripheral control circuitry under the array (e.g., CMOS-under-array). Some aspects of the invention were motivated in overcoming problems associated with so-called "block-bending" (a block stack tipping/tilting sideways relative to its longitudinal orientation during fabrication), although the invention is not so limited. Block-bending may be adversely influenced by laterally-outward bowing or bending of operative memory-cell pillars. Such bowing/bending may primarily occur at longitudinal ends or lateral edges of blocks/sub-blocks where a 2D horizontal pattern of the memory-cell pillars stops. This may occur when the memory-cell pillars have intrinsic compressive mechanical stress that is greater than that, if any, of material adjacent thereto. Some aspects of the invention were motivated in overcoming problems associated such laterally-outward bowing/bending of operative memory-cell pillars, although the invention is not so limited.

Figure 1:
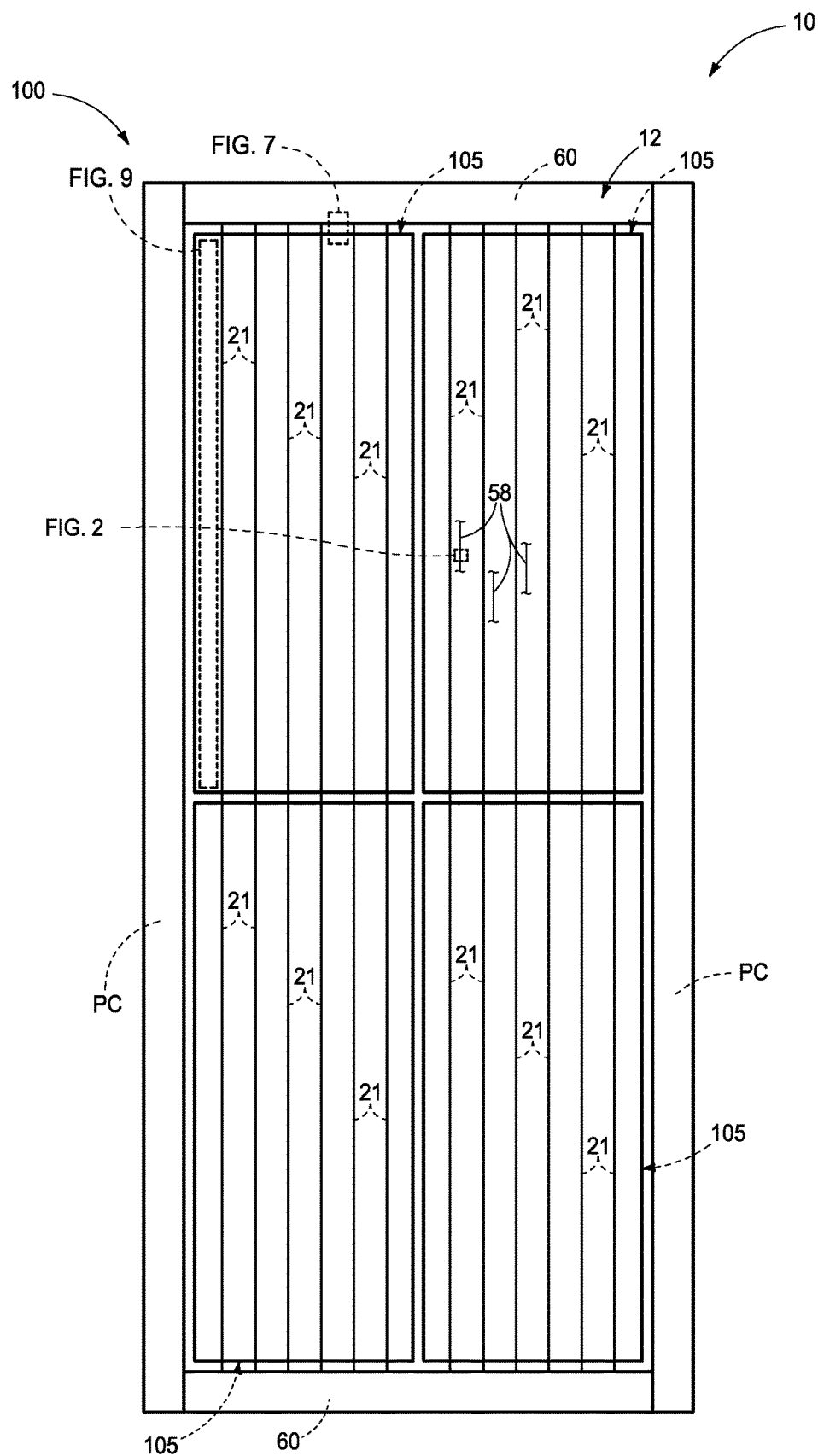
Figure 5:
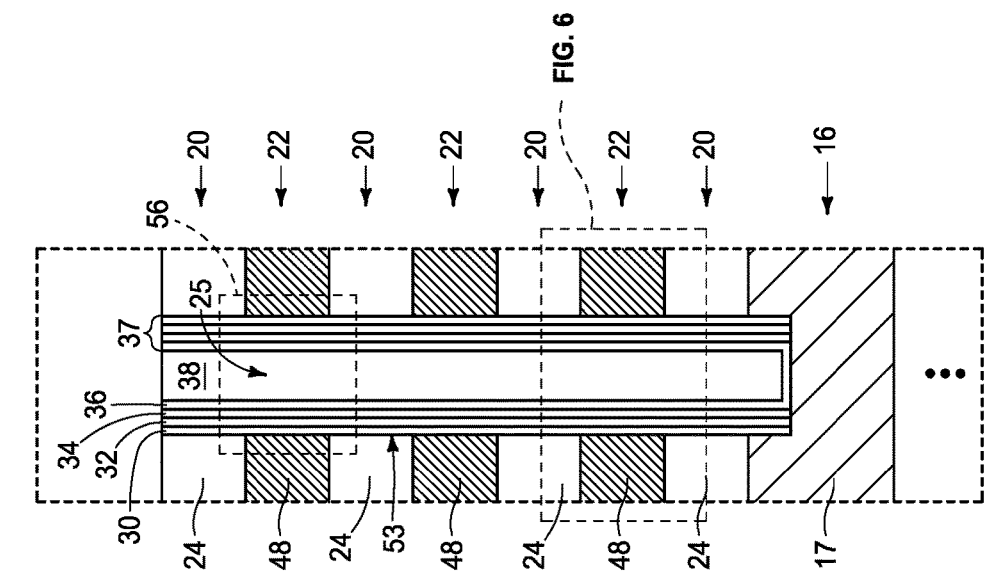
Figure 4:
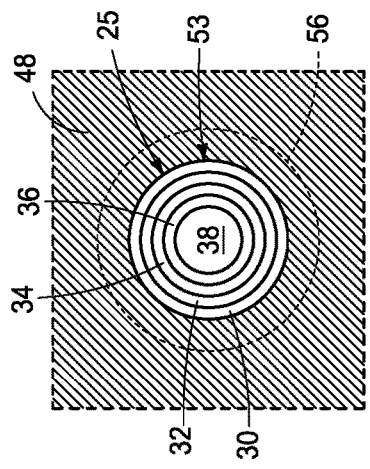
Figure 7:
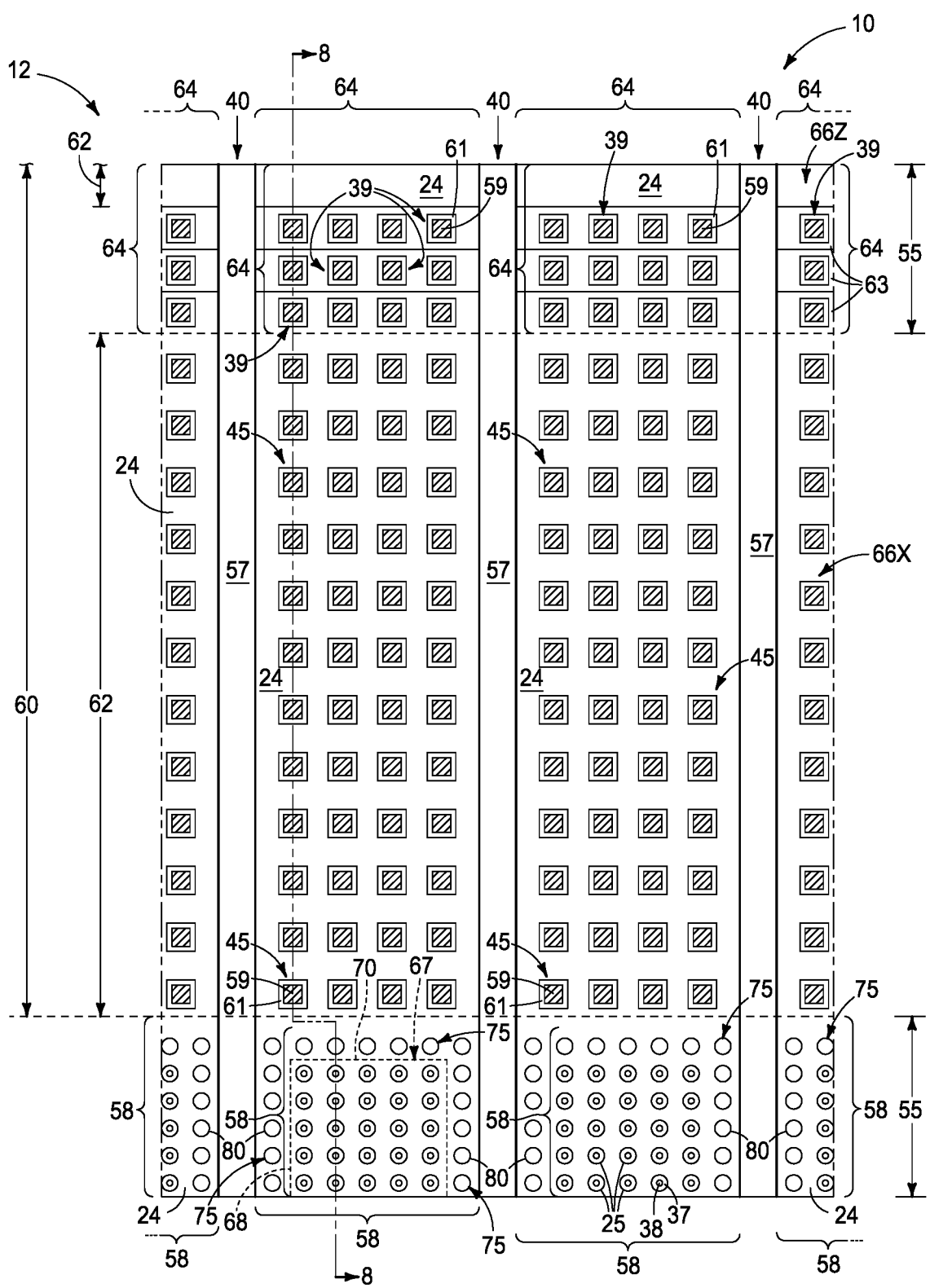
Figure 8:
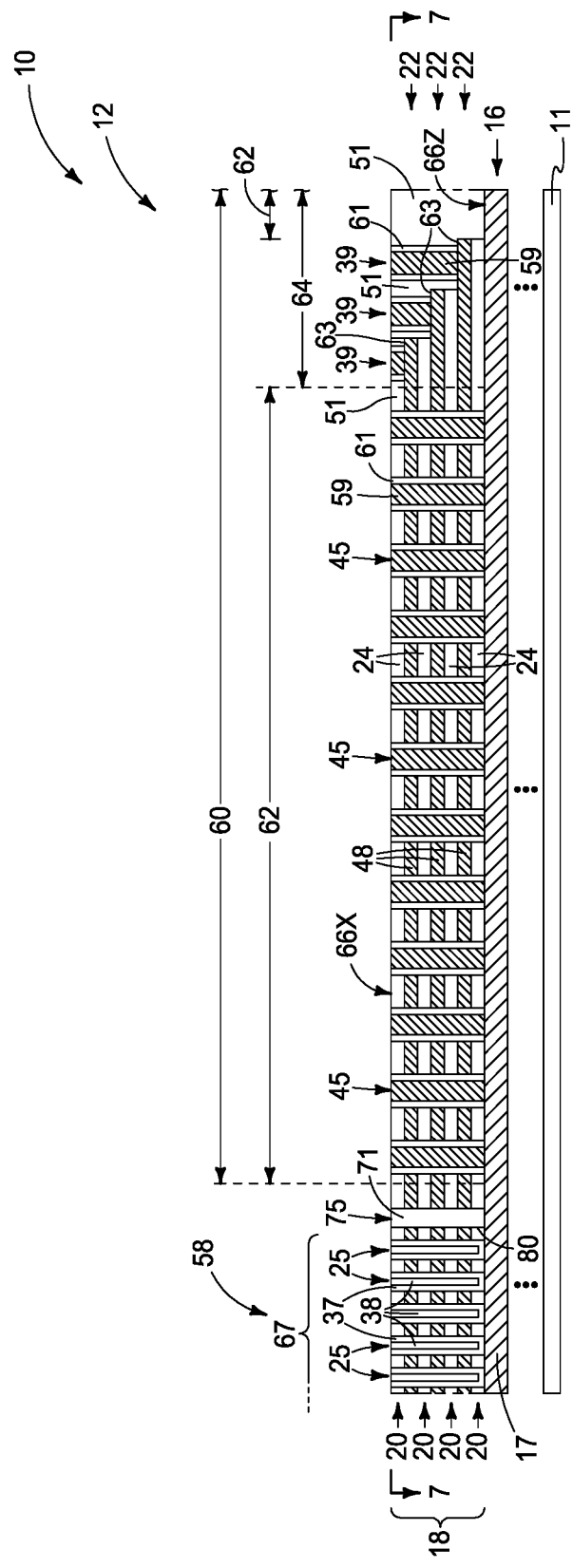
Figure 9:
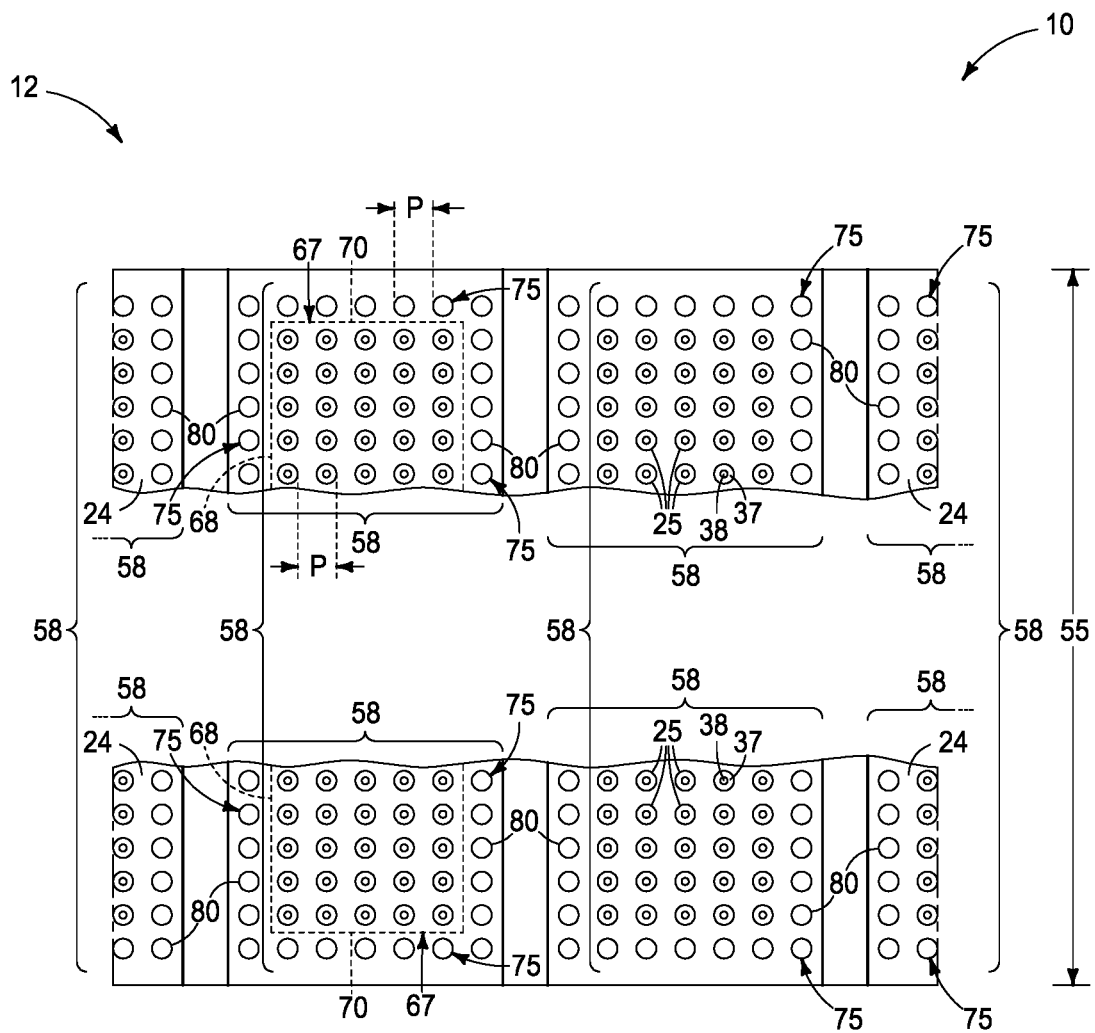

First example embodiments are described with reference to FIGS. 1-9. FIG. 1 diagrammatically shows an example embodiment construction 10 comprising a die or die area 100 comprising a memory array 12. Die or die area 100 may be part of a larger substrate (e.g., a semiconductor wafer, and not shown). Alternately, and by way of examples only, die or die area 100 may be part of an integrated circuit chip or part of a package containing an integrated circuit chip. Example die 100 comprises at least one memory-plane region 105 (four being shown), laterally-spaced memory blocks 58 in individual memory-plane regions 105, through-array-via regions 21, a stair-step region 60 (two being shown at opposing longitudinal ends of side-by-side pairs of the memory planes), and a peripheral circuitry region PC (two being shown). In this document, "block" is generic to include "sub-block". Stair-step region 60 may be considered as comprising landing regions 62. FIGS. 7-9 are diagrammatic larger and varied scale views of portions of die or die area 100.

Memory array 12 comprises elevationally-extending strings 49 of memory cells 56 that are shown by way of example only as being above a base substrate 11 that comprises one or more of conductive/conductor/conducting, semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-9-depicted materials. For example, other partially or wholly fabricated components of integrated circuitry may be provided somewhere above, about, or within base substrate 11. Control and/or other peripheral circuitry for operating components within array 12 of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

An example conductor tier 16 comprising conductive material 17 is above substrate 11. Conductor tier 16 may comprise part of control circuitry (e.g., peripheral-under-array circuitry and/or a common source line or plate) used to control read and write access to memory cells 56 within array 12. An example vertical stack 18 is above conductor tier 16 within individual laterally-spaced memory blocks 58. Such comprises vertically-alternating insulative tiers 20 and conductive tiers 22. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Example insulative tiers 20 comprise insulative material 24 (e.g., silicon dioxide and/or silicon nitride). Example conductive tiers 22 comprise conducting material 48, for example that forms individual conductive lines 29 (e.g., wordlines). A thin insulative liner (e.g., $Al_2O_3$ and not shown) may surround conducting material 48. Example memory-cell strings 49 comprising memory cells 56 are within channel openings 25 and extend to conductor tier 16. Memory-cell strings 49 may go partially into conductive material 17 of conductor tier 16 as shown.

Memory blocks 58 may be longitudinally elongated and oriented, for example along a direction 55. Such are shown as being separated or spaced by intervening material 57 that is in horizontally-elongated trenches 40. Intervening material 57 may provide lateral electrical isolation (insulation) between immediately-laterally-adjacent memory blocks 58. Intervening material 57 may include one or more of insulative, semiconductive, and conducting materials and, regardless, may facilitate conductive tiers 22 from shorting relative one another. Example insulative materials are one or more of $SiO_2$, $Si_3N_4$, $Al_2O_3$, and undoped polysilicon. As further examples, intervening material 57 may comprise a laterally-outermost insulative material (e.g., silicon dioxide and not shown) and a laterally-inner material (e.g., undoped polysilicon and not shown) of different composition from that of the laterally-outermost insulative material. Additionally, and/or alternately, intervening material 57 may comprise one or more through-array-vias (TAVs)(not shown).

Transistor channel material is in the individual channel openings elevationally along the insulative tiers and the conductive tiers, and comprises at least part of individual operative memory-cell pillars which are directly electrically coupled with conductive material in the conductor tier. Individual memory cells of the memory array may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 2-6 show one embodiment wherein memory-cell strings 49 comprise charge-blocking material 30, storage material 32, and charge-passage material 34 in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Memory-cell strings 49 also comprise channel material 36 in channel openings 25 elevationally along insulative tiers 20 and conductive tiers 22, thus comprising individual operative memory-cell pillars 53. Materials 30, 32, 34, and 36 are collectively shown as and only designated as material 37 in FIGS. 2 and 3 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may have been conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Operative memory-cell pillars 53 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop operative memory-cell pillars 53 for better conductive connection to overlying circuitry (not shown). Regardless, in some embodiments, operative memory-cell pillars 53 have intrinsic compressive mechanical stress (i.e., overall when of multiple different materials/structures; e.g., in negative Megapascals/Gigapascals).

Figure 6:
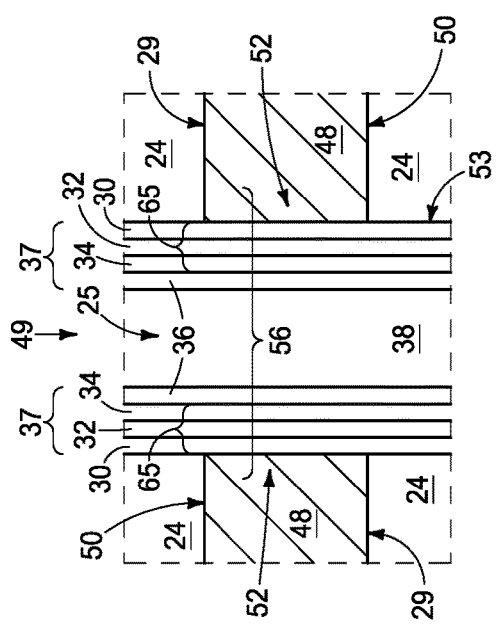

Approximate locations of transistors and/or memory cells 56 are indicated with a bracket in FIG. 6 and some with dashed outlines in FIGS. 2-5, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 6) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Conductive tiers 22 and insulative tiers 20 of memory blocks 58 extend into stair-step regions 60 (FIG. 8). Example stair-step region 60 comprises laterally-spaced landing regions 62 and laterally-spaced stair-step-structures 64 (FIGS. 7 and 8). Example landing regions 62 associated with stair-step structures 64 comprise a landing crest 66X and a landing foot 66Z. Stair-step structures 64 comprise steps 63. Example operative TAVs 45 are shown extending through stack 18 in landing crest 66X. One or more circuit-operative conductive vias 39 extend downwardly to conductive surfaces of individual steps 63. Example TAVs 45 and vias 39 are shown as comprising a conductive-material core 59 surrounded by insulative material 61 (e.g., silicon dioxide and/or silicon nitride). Insulative material 51 (e.g., silicon dioxide) is shown atop stair-step structure 64.

Operative memory-cell pillars 53 are shown as being arranged in a horizontal pattern 67 (e.g., a 2D lattice that may be Bravais or non-Bravais, with an example Bravais rectangular lattice being shown). Example horizontal pattern 67 comprises a lateral edge 68 (two opposing lateral edges 68 being shown) and a longitudinal end 70 (two being shown in FIG. 9). By way of example and for brevity only, horizontal pattern 67 results from operative memory-cell pillars 53 being arranged in groups or columns of five per row. Any alternate existing or future-developed arrangement and construction may be used.

At least one dummy structure 75 is in individual memory blocks 58 and extends through at least upper (e.g., upper-most) insulative tiers 20 and conductive tiers 22 (e.g., dummy structures 75 being in dummy-structure openings 80). In this document, a "dummy-structure opening" is an opening in which a "dummy structure" has been or will be formed. A "dummy structure" is a circuit-inoperative structure that may be in a finished circuitry construction and, if so, in all operation of the circuitry has no current flow there-through and which may be a circuit inoperable dead end that is not part of a current flow path of a circuit even if extending to or from an electronic component. The at least one dummy structure 75 is at least one of (a) and (b), where (a): at a lateral edge 68 of horizontal pattern 67, and (b): at a longitudinal end 70 of horizontal pattern 67. In one embodiment, the at least one dummy structure has intrinsic tensile mechanical stress (i.e., overall when of multiple different physical or chemical composition materials/structures; e.g., in positive Megapascals/Gigapascals)). Memory array 12 may comprise the (a) (e.g., only the (a)), the (b) (e.g., only the (b)), or both the (a) and the (b). FIGS. 2, 3, and 7-9 show an example where the at least one dummy structure 75 comprises both the (a) and the (b). Additionally, FIGS. 2, 3, and 7-9 show an example embodiment where another of the at least one dummy structure 75 is at both of two opposing lateral edges 68 of horizontal pattern 67. Further, FIGS. 2, 3, and 7-9 also show an example embodiment wherein individual memory blocks 58 comprise multiple dummy structures 75 in the at least one of the (a) and the (b)(e.g., in both the (a) and the (b) as shown).

Example dummy structure 75 comprises material 71 that may be homogeneous (i.e., both compositionally and physically, e.g., physically: either amorphous or same crystalline structure) or non-homogeneous (i.e., at least one of different composition or different intrinsic physical attribute; e.g., amorphous or different crystalline structures). Regardless, and in one embodiment, dummy structure 75 comprises insulative material and in one embodiment comprises conductive material. By way of examples only, example materials that may have intrinsic tensile mechanical stress include $AlO_x$ (e.g., $Al_2O_3$), $Si_3N_4$, polysilicon, TiN, $TiO_2$, WN, and $W_2N$. In one ideal embodiment, the insulative material comprises $AlO_x$ (e.g., $Al_2O_3$), and in one embodiment all of dummy structure 75 is the insulative material.

In one embodiment, all material 71 of dummy structure 75 has intrinsic tensile mechanical stress and in another embodiment some material of dummy structure 75 has intrinsic compressive mechanical stress. In one such later embodiment, at least laterally-outermost material of dummy structure 75 has intrinsic tensile mechanical stress. For example, and by way of example only, a laterally or radially-inner core of a dummy structure may have intrinsic compressive mechanical stress whereas a laterally or peripherally outer-most portion thereof may have intrinsic tensile mechanical stress, with the dummy structure overall exhibiting intrinsic tensile mechanical stress even though all portions thereof may not locally so-exhibit.

In one embodiment and as shown, dummy structure 75 is a dummy pillar 75, and in one such embodiment individual memory blocks 58 comprise multiple of such dummy pillars in the at least one of the (a) and the (b)(in both of the (a) and the (b) being shown). By way of example only, dummy pillars 75 are shown as extending in a single row and/or single column with respect to each of lateral edges 68 and longitudinal ends 70 of horizontal pattern 67, and in one embodiment completely horizontally encircling horizontal pattern 67. Further, dummy structures/pillars 75 by way of example are shown as extending all along individual lateral edges 68 and all along longitudinal ends 70 of horizontal pattern 67, although neither is required. Further and regardless, dummy structures/pillars 75 may extend along only one lateral edge 68 and/or along only one longitudinal end 70 of horizontal pattern 67. Further and regardless, multiple rows/columns of dummy structures/pillars 75 may be along one or more lateral edges 68 and/or one or along one or more longitudinal ends 70 of a horizontal pattern 67 (not shown).

Further and by way of example only, operative memory-cell pillars 53 are shown as having a common horizontal peripheral shape (circular as shown) and common peripheral size at a horizontal level of vertical stack 18. Reference is made to some given horizontal level of vertical stack 18 as one or both of peripheral shape and peripheral size might vary vertically within stack 18 (not shown), for example if operative memory-cell pillars taper to be narrower (not shown) deeper within the stack. Regardless, and in one embodiment as shown, dummy pillars 75 have a common horizontal peripheral shape and common peripheral size at the horizontal level of the vertical stack that is the same as said common horizontal peripheral shape and common peripheral size of operative memory-cell pillars 53 at the horizontal level of the vertical stack. Further, in one such embodiment and as shown, dummy pillars 75 have pitch P (FIG. 9) that is the same as that of operative memory-cell pillars 53. Alternately, and by way of example only, the dummy pillars may have a horizontal peripheral shape and peripheral size at the horizontal level of the vertical stack that is of different at least peripheral size (and/or shape, and not shown) as said common horizontal peripheral size, and which may be less than or greater than said common horizontal peripheral size. For example, and by way of example only, where the respective peripheral shapes are all circular, circles of the dummy pillars may be larger or smaller than a common horizontal peripheral size of circles of the operative memory-cell pillars.

Any other attribute(s) or aspect(s) as shown and/or described herein with respect to other embodiments may be used in the embodiments shown and described with reference to FIGS. 1-9.

Figure 10:
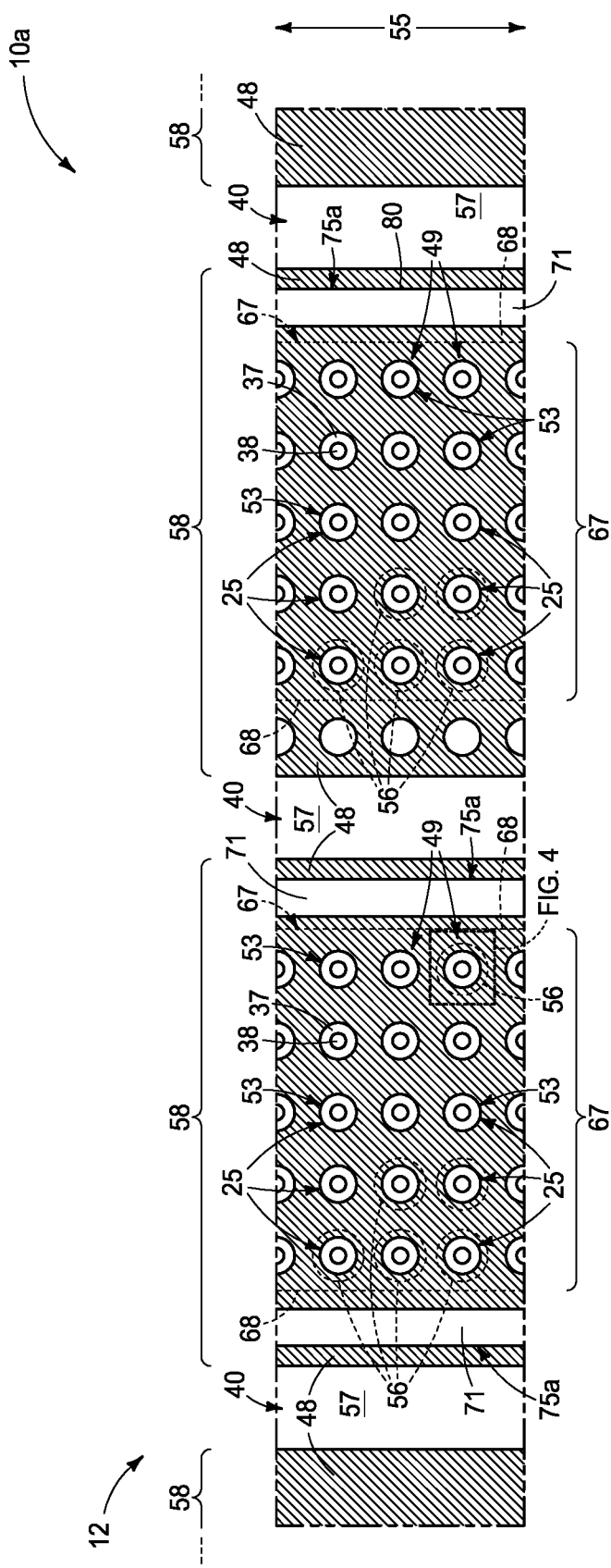
FIGS. 10 and 11 are views of a memory array comprising strings of memory cells in accordance with an embodiment of the invention.
Figure 11:
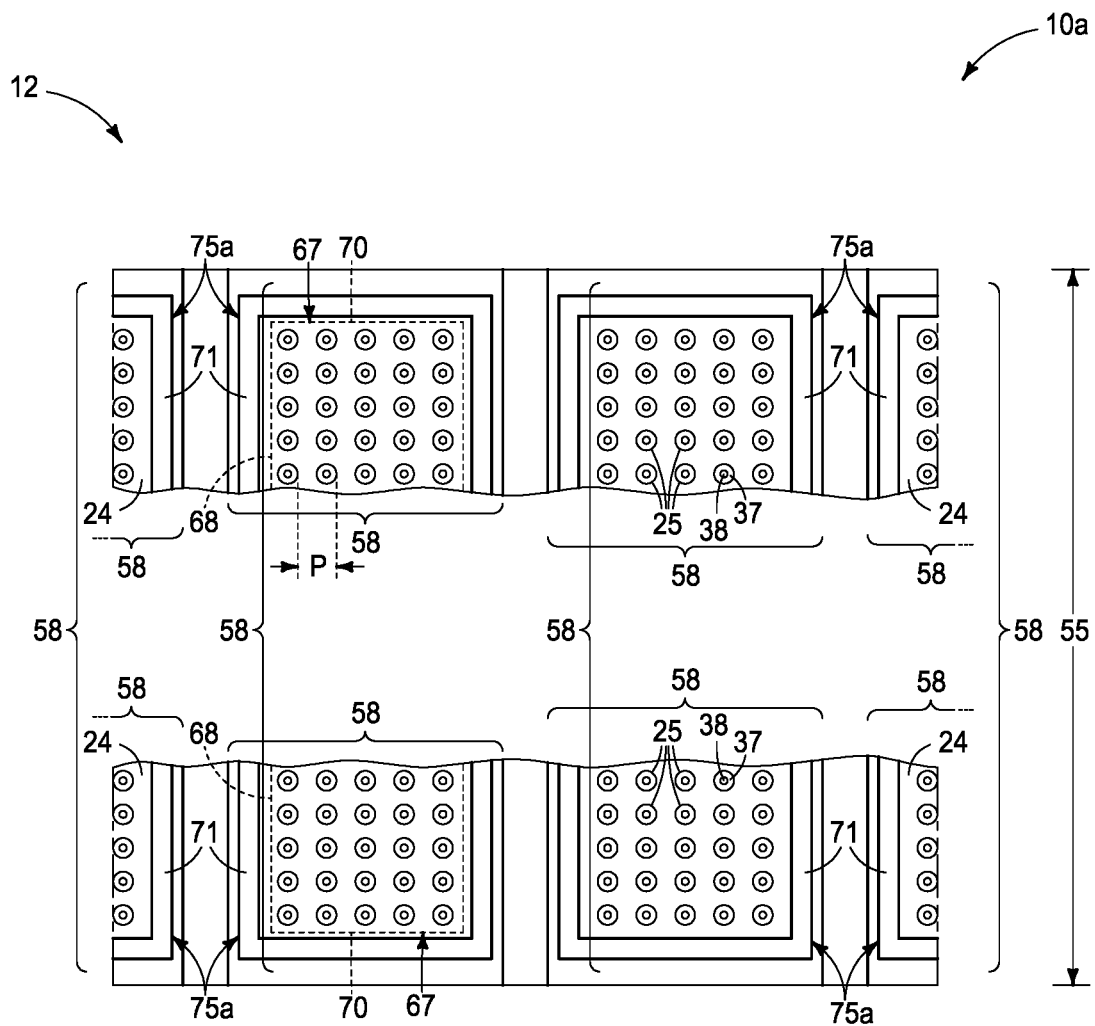

An alternate example construction 10a of a memory array 12 is described with reference to FIGS. 10 and 11 (corresponding positionally to FIGS. 2 and 9, respectively). Like numerals from the above-described embodiments have been used where appropriate, with some construction differences being indicated with the suffix "a" or with different numerals. Memory array 12 comprises at least one dummy structure 75a that is a horizontally-elongated wall 75a. In one such embodiment and as shown, dummy structure/wall 75a completely encircles horizontal pattern 67. FIGS. 10 and 11 also show an example embodiment wherein individual memory blocks 58 comprise only one dummy structure 75a in the at least one of the (a) and the (b) (e.g., only one wall per at least one side 68 or at least one end 70). By way of example only, dummy structure/wall 75a is shown as having the same width as that of dummy pillar 75, although such is not required. Any other attribute(s) or aspect(s) as shown and/or described herein with respect to other embodiments may be used.

Figure 12:
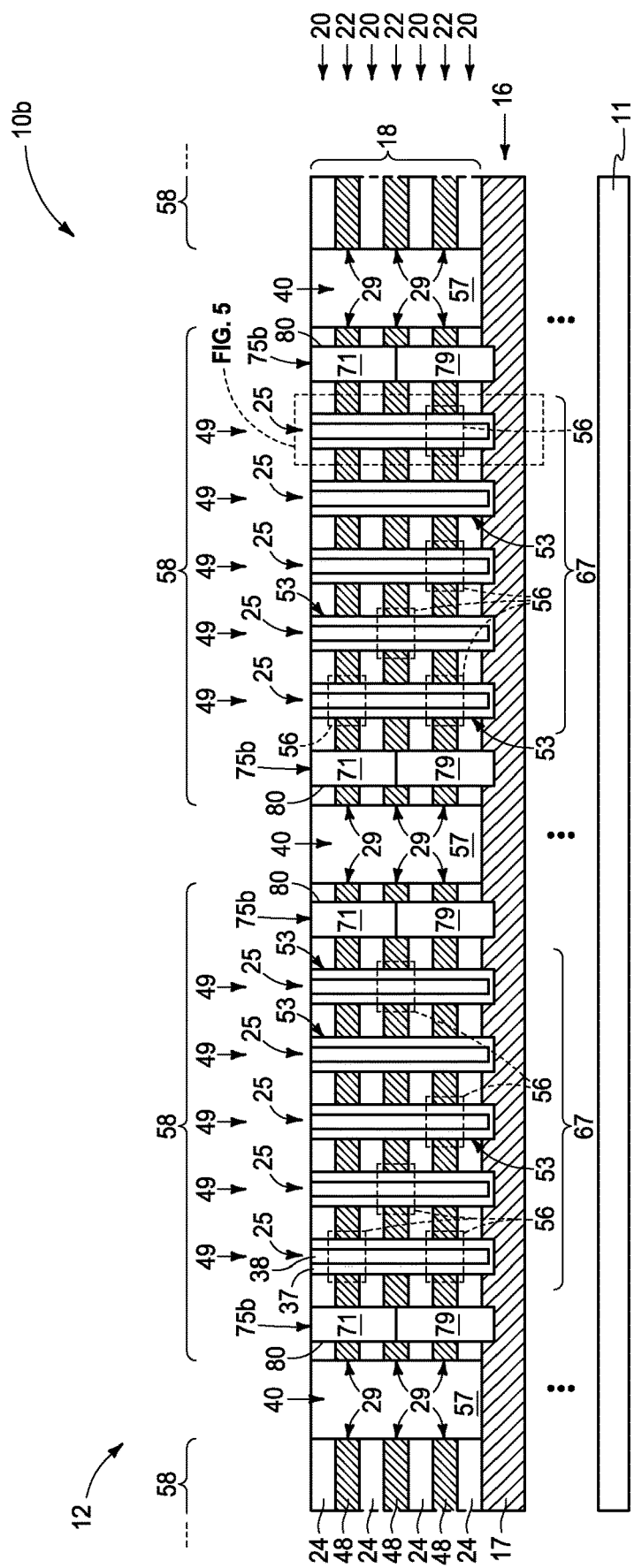
FIGS. 12 and 13 are views of a memory array comprising strings of memory cells in accordance with an embodiment of the invention.
Figure 13:
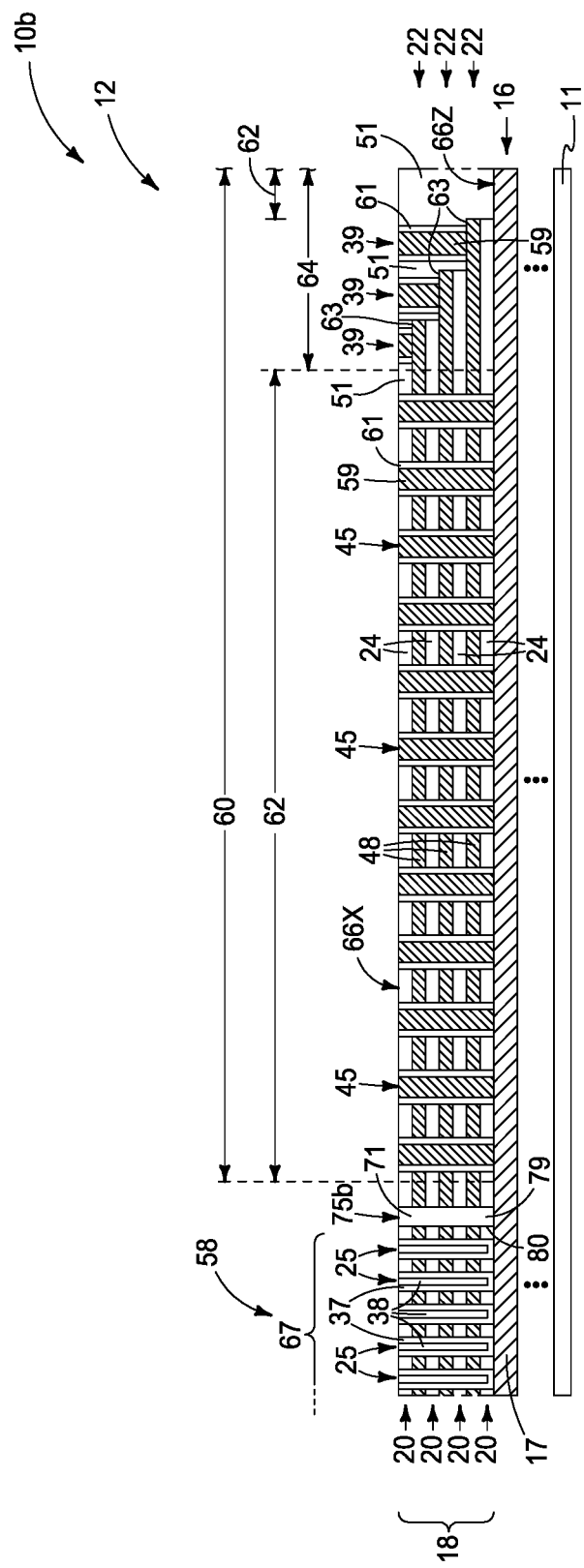

FIGS. 3 and 8 show an example embodiment wherein the at least one dummy structure 75 extends through all of insulative tiers 20 and conductive tiers 22 through which operative memory-cell pillars 53 extend. An alternate example construction 10b of a memory array 12 is shown in FIGS. 12 and 13 (corresponding positionally to FIGS. 3 and 8, respectively). Like numerals from the above-described embodiments have been used where appropriate, with some construction differences being indicated with the suffix "b" or with different numerals. FIGS. 12 and 13 show dummy structures 75b that extend through uppermost insulative tiers 20 and conductive tiers 22 and do not extend through a lowest of insulative tiers 20 and 22. An example void space 79 may be below material 71, as shown. Any other attribute(s) or aspect(s) as shown and/or described herein with respect to other embodiments may be used.

Certain materials depending upon deposition technique and underlying substrate material may be deposited over a substrate to have intrinsic tensile mechanical stress as-deposited, intrinsic compressive mechanical stress as-deposited, or neutral/no intrinsic mechanical stress as-deposited. Also, the intrinsic mechanical stress of a deposited material may be modified after its deposition. For example, heating a substrate will tend to reduce degree of tensile intrinsic mechanical stress of an intrinsic tensile mechanical stressed layer and increase compressive intrinsic mechanical stress of an intrinsic compressive mechanical stressed layer. The artisan is capable of selecting materials, deposition parameters, and subsequent processing when it is desired that dummy structures have intrinsic tensile mechanical stress, for example as is disclosed in U.S. Pat. No. 8,492,278.

Provision of dummy structures that have intrinsic tensile mechanical stress when memory-cell pillars have intrinsic compressive mechanical stress ideally produces a bowing or bending force that is opposite to that of the memory-cell pillars at the end(s) and/or edge(s) of a pattern of the memory-cell pillars. The artisan may determine materials, dummy-structure size, dummy-structure shape, and/or dummy-structure number that ideally offsets the opposite bowing/bending force of the memory-cell pillars, with several examples having been provided herein.

An embodiment of the invention comprises a memory array comprising strings of memory cells comprising laterally-spaced memory blocks individually comprising a vertical stack comprising alternating insulative tiers and conductive tiers. Operative memory-cell pillars extend through the insulative tiers and the conductive tiers in individual of the memory blocks independent of whether formed in a horizontal pattern and independent of whether having intrinsic compressive mechanical stress. At least one dummy structure is in the individual memory blocks, with such at least one dummy structure extending through uppermost of the insulative tiers and the conductive tiers and not extending through a lowest of the insulative tiers and the conductive tiers independent of whether the at least one dummy structure is at least one of the (a) and the (b) and independent of whether having intrinsic tensile mechanical stress. Any other attribute(s) or aspect(s) as shown and/or described herein with respect to other embodiments may be used.

An embodiment of the invention comprises a memory array comprising strings of memory cells comprising laterally-spaced memory blocks individually comprising a vertical stack comprising alternating insulative tiers and conductive tiers. A horizontal pattern of operative memory-cell pillars extends through the insulative tiers and the conductive tiers and individual of the memory blocks independent of whether the operative memory cell pillars have intrinsic compressive mechanical stress. A plurality of insulative dummy pillars are in the individual memory blocks, with such extending through at least upper of the insulative tiers and the conductive tiers and at least predominantly comprise $AlO_x$ and independent of whether having intrinsic tensile mechanical stress. The insulative dummy pillars are spaced longitudinally along opposing lateral edges of the horizontal pattern longitudinally along the individual memory blocks independent of the (b). Any other attribute(s) or aspect(s) as shown and/or described herein with respect to other embodiments may be used.

Embodiments of the invention encompass methods used in forming a memory array. Such embodiments encompass so-called "gate-first" processing, and other processing whether existing or future-developed independent of when transistor gates are formed. Memory arrays formed in accordance with method embodiments may incorporate, form, and/or have any of the attributes described with respect to device embodiments.

In one embodiment, a method of forming a memory array comprising strings of memory cells comprises forming dummy structures (e.g., 75) in channel openings (e.g., 25) and in dummy-structure openings (e.g., 80) in a stack (e.g., 18) comprising vertically-alternating first tiers (e.g., 22) and second tiers (e.g., 20). The dummy structures are removed from the channel openings to leave the dummy structures in the dummy structure openings. After the removing, operative memory-cell pillars (e.g., 53) are formed in the channel openings. In one such embodiment, the removing is by etching that is conduced selectively relative to masking material (e.g., photoresist and/or hard-masking material) that covers the dummy structures in the dummy structure openings during such etching. In one embodiment, the dummy structures in the channel openings and the dummy structures in dummy-structure openings are formed at the same time. In one embodiment, the channel openings and the dummy-structure openings are formed at the same time.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume.

Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. A horizontal pattern of operative memory-cell pillars extends through the insulative tiers and the conductive tiers in individual of the memory blocks. The operative memory-cell pillars have intrinsic compressive mechanical stress. At least one dummy structure in the individual memory blocks extends through at least upper of the insulative tiers and the conductive tiers. The at least one dummy structure is at least one of (a) and (b), where (a): at a lateral edge of the horizontal pattern, and (b): at a longitudinal end of the horizontal pattern. The at least one dummy structure has intrinsic tensile mechanical stress.

In some embodiments, a memory array comprising strings of memory cells comprises laterally-spaced memory blocks individually comprising a vertical stack comprising alternating insulative tiers and conductive tiers. Operative memory-cell pillars extend through the insulative tiers and the conductive tiers in individual of the memory blocks. At least one dummy structure is in the individual memory blocks. The at least one dummy structure extends through uppermost of the insulative tiers and the conductive tiers and does not extend through a lowest of the insulative tiers and the conductive tiers.

In some embodiments, a memory array comprising strings of memory cells comprises laterally-spaced memory blocks individually comprising a vertical stack comprising alternating insulative tiers and conductive tiers. A horizontal pattern of operative memory-cell pillars extends through the insulative tiers and the conductive tiers in individual of the memory blocks. A plurality of insulative dummy pillars are in the individual memory blocks. The insulative dummy pillars extend through at least upper of the insulative tiers and the conductive tiers and at least predominately comprising $AlO_x$. The insulative dummy pillars are spaced longitudinally along opposing lateral edges of the horizontal pattern longitudinally along the individual memory blocks.

In some embodiments, a method of forming a memory array comprising strings of memory cells comprises forming dummy structures in channel openings and in dummy-structure openings in a stack comprising vertically-alternating first tiers and second tier. The dummy structures are removed from the channel openings to leave the dummy structures in the dummy structure openings. After the removing, operative memory-cell pillars are formed in the channel openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising strings of memory cells, comprising:

laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks, the operative memory-cell pillars having intrinsic compressive mechanical stress;

at least one dummy structure in the individual memory blocks extending through at least upper of the insulative tiers and the conductive tiers; the at least one dummy structure being at least one of (a) and (b), where (a): at a lateral edge of the horizontal pattern, and (b): at a longitudinal end of the horizontal pattern; the at least one dummy structure having intrinsic tensile mechanical stress; and the individual memory blocks comprise only one dummy structure in the at least one of the (a) and the (b).

2. A memory array comprising strings of memory cells, comprising:

laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks, the operative memory-cell pillars having intrinsic compressive mechanical stress;

at least one dummy structure in the individual memory blocks extending through at least upper of the insulative tiers and the conductive tiers; the at least one dummy structure being at least one of (a) and (b), where (a): at a lateral edge of the horizontal pattern, and (b): at a longitudinal end of the horizontal pattern; the at least one dummy structure having intrinsic tensile mechanical stress; and the at least one dummy structure comprising the (a).

3. The memory array of claim 2 wherein the lateral edge is one of two opposing lateral edges, another of the at least one dummy structure being at the other of the two opposing lateral edges.

4. The memory array of claim 2 comprising the (a) and the (b).

5. The memory array of claim 4 wherein the lateral edge is one of two opposing lateral edges, another of the at least one dummy structure being at the other of the two opposing lateral edges.

6. The memory array of claim 2 wherein the at least one dummy structure comprises a plurality of insulative dummy pillars that are spaced longitudinally along the lateral edge of the horizontal pattern.

7. A memory array comprising strings of memory cells, comprising:

laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks, the operative memory-cell pillars having intrinsic compressive mechanical stress;

at least one dummy structure in the individual memory blocks extending through at least upper of the insulative tiers and the conductive tiers; the at least one dummy structure being at least one of (a) and (b), where (a): at a lateral edge of the horizontal pattern, and (b): at a longitudinal end of the horizontal pattern; the at least one dummy structure having intrinsic tensile mechanical stress;

the at least one dummy structure is a dummy pillar;

the individual memory blocks comprise multiple of the dummy pillars in the at least one of the (a) and the (b); and the dummy pillars horizontally completely encircle the horizontal pattern.

8. A memory array comprising strings of memory cells, comprising:

laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks, the operative memory-cell pillars having intrinsic compressive mechanical stress;

at least one dummy structure in the individual memory blocks extending through at least upper of the insulative tiers and the conductive tiers; the at least one dummy structure being at least one of (a) and (b), where (a): at a lateral edge of the horizontal pattern, and (b): at a longitudinal end of the horizontal pattern; the at least one dummy structure having intrinsic tensile mechanical stress; and the at least one dummy structure is a horizontally-elongated wall.

9. The memory array of claim 8 wherein the wall completely encircles the horizontal pattern.

10. A memory array comprising strings of memory cells, comprising:

laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks, the operative memory-cell pillars having intrinsic compressive mechanical stress;

at least one dummy structure in the individual memory blocks extending through at least upper of the insulative tiers and the conductive tiers; the at least one dummy structure being at least one of (a) and (b), where (a): at a lateral edge of the horizontal pattern, and (b): at a longitudinal end of the horizontal pattern; the at least one dummy structure having intrinsic tensile mechanical stress; and the at least one dummy structure extends through uppermost of the insulative tiers and the conductive tiers and does not extend through a lowest of the insulative tiers and the conductive tiers, a void space being immediately-below the dummy structure.

11. A memory array comprising strings of memory cells, comprising:

laterally-spaced memory blocks individually comprising a vertical stack comprising alternating insulative tiers and conductive tiers, operative memory-cell pillars extending through the insulative tiers and the conductive tiers in individual of the memory blocks; and at least one dummy structure in the individual memory blocks, the at least one dummy structure extending through uppermost of the insulative tiers and the conductive tiers and not extending through a lowest of the insulative tiers and the conductive tiers, a void space being immediately-below the dummy structure.

12. The memory array of claim 11 wherein the operative memory-cell pillars have intrinsic compressive mechanical stress.

13. The memory array of claim 11 wherein the at least one dummy structure has intrinsic tensile mechanical stress.

14. The memory array of claim 11 wherein the operative memory-cell pillars are in a horizontal pattern, the at least one dummy structure being at least one of (a) and (b), where (a): at a lateral edge of the horizontal pattern, and (b): at a longitudinal end of the horizontal pattern.

15. The memory array of claim 11 wherein the at least one dummy structure is a dummy pillar.

16. The memory array of claim 11 wherein the at least one dummy structure is a horizontally-elongated wall.

17. A memory array comprising strings of memory cells, comprising:
    laterally-spaced memory blocks individually comprising a vertical stack comprising alternating insulative tiers and conductive tiers, a horizontal pattern of operative memory-cell pillars extending through the insulative tiers and the conductive tiers in individual of the memory blocks; and
    a plurality of insulative dummy pillars in the individual memory blocks, the insulative dummy pillars extending through at least upper of the insulative tiers and the conductive tiers and at least predominately comprising $AlO_x$; the insulative dummy pillars being spaced longitudinally along opposing lateral edges of the horizontal pattern longitudinally along the individual memory blocks.

18. The memory array of claim 17 wherein the insulative dummy pillars consist essentially of or consist of the $AlO_x$.

19. The memory array of claim 17 wherein the insulative dummy pillars comprise conductive material.

20. The memory array of claim 17 wherein the insulative dummy pillars are devoid of conductive material.

21. The memory array of claim 17 wherein the insulative dummy pillars extend through all of the insulative tiers and the conductive tiers through which the operative memory-cell pillars extend.

22. The memory array of claim 17 wherein the insulative dummy pillars extend through uppermost of the insulative tiers and the conductive tiers and do not extend through a lowest of the insulative tiers and the conductive tiers.

23. A method of forming a memory array comprising strings of memory cells, comprising:
    forming dummy structures in channel openings and in dummy-structure openings in a stack comprising vertically-alternating first tiers and second tiers;
    removing the dummy structures from the channel openings to leave the dummy structures in the dummy structure openings; and
    after the removing, forming operative memory-cell pillars in the channel openings.

24. The method of claim 23 wherein the removing is by etching that is conduced selectively relative to masking material that covers the dummy structures in the dummy-structure openings during said etching.

25. The method of claim 23 wherein the dummy structures in the channel openings and the dummy structures in dummy-structure openings are formed at the same time.

26. The method of claim 25 wherein the channel openings and the dummy structure openings are formed at the same time.

27. The method of claim 23 wherein the operative memory-cell pillars in the channel openings and the dummy structures in the dummy-structure openings are in a finished construction of the memory array, the operative memory-cell pillars having intrinsic compressive mechanical stress in the finished construction, the dummy structures having intrinsic tensile mechanical stress in the finished construction.

28. The method of claim 23 wherein the channel openings and the operative memory-cell pillars therein are formed in a horizontal pattern, the dummy structure openings and the dummy-structures therein being at least one of (a) and (b), where (a): at a lateral edge of the horizontal pattern, and (b): at a longitudinal end of the horizontal pattern.

* * * * *